Jan. 20, 1959 C. W. MUELLER ET AL 2,870,049

SEMICONDUCTOR DEVICES AND METHOD OF MAKING SAME

Filed July 16, 1956 2 Sheets-Sheet 1

INVENTORS
Charles W. Mueller
& Ralph L. Sherwood
BY
J. L. Whittaker
ATTORNEY

INVENTORS
Charles W. Mueller
& Ralph L. Sherwood.
BY J. L. Whittaker
ATTORNEY

United States Patent Office 2,870,049

Patented Jan. 20, 1959

2,870,049

SEMICONDUCTOR DEVICES AND METHOD OF MAKING SAME

Charles W. Mueller, Princeton, and Ralph L. Sherwood, Mercerville, N. J., assignors to Radio Corporation of America, a corporation of Delaware Application July 16, 1956, Serial No. 598,180

10 Claims. (Cl. 148—1.5)

This invention relates to improved semiconductor devices and particularly to improved methods of making rectifying barriers in semiconductor devices by the diffusion process, and to devices produced thereby.

Rectifying barriers in semiconductor devices may be fabricated by means of the vapor diffusion technique, in which a semiconductive body is placed in an atmosphere of conductivity type-determining, so-called impurity material. Molecules of the conductivity-type-determining material impinge on the surface of the semiconductive body, and diffuse into the bulk for a short distance. Thus a thin surface layer containing diffused material is formed on the semiconductive body, and the conductivity of the surface layer is different from that of the bulk. The impurity material may be so chosen that the surface layer may be of the same conductivity-type as the bulk but of different magnitude of conductivity, or it may be of opposite conductivity type.

One previous method of accomplishing this diffusion doping from the vapor state was to place the semiconductor body in a quartz tube, seal one end of the tube, evacuate the tube, then introduce vapors of a conductivity type-determining material. Disadvantages of this method are that it is cumbersome, complicated, and costly. It requires the use of vacuum pumps, valves, and glass-blowing, thus becoming time-consuming as well as expensive.

An object of the present invention is to provide improved methods of making semiconductor devices.

Another object of the invention is to provide improved methods of making semiconductor devices with one or more rectifying junctions.

Another object of the invention is to provide improved methods of making semiconductor devices by the diffusion from the vapor state of conductivity type-determining materials.

A further object is to provide improved vapor diffusion semi-conductor devices.

These and other objects of the invention are accomplished in the following manner: the semiconductor wafers into which the diffusion of conductivity type-determining material is desired are placed in an enclosed space, such as a well in a jig; a semiconductive wafer heavily alloyed or doped with the desired conductivity type-determining material is placed in the same well; the jig is then heated in a furnace, so that vapors of the conductivity type-determining material are given off by the doped wafer and diffuse into the surface of the other semiconductor wafers.

The invention will be described in greater detail with reference to the accompanying drawing, in which Figure 1 is an exploded elevational view of one form of jig apparatus according to the invention;

Similar reference characters are applied to similar elements throughout the drawings.

Figure 1:
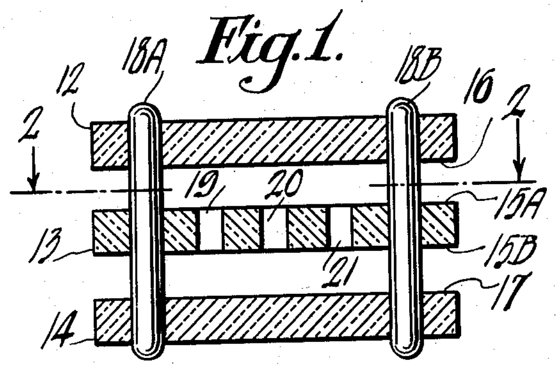

Referring to Figure 1 of the drawing, a jig is made by stacking three separate plates, 12, 13, 14, of a suitable inert refractory material such as quartz or a ceramic. The two end plates 12 and 14 are solid, while the central plate 13 has one or more apertures 19, 20, 21 cut therethrough. The meeting surfaces 15A—16, and 15B—17, are made plane parallel and polished. The three plates are aligned and held together by rods 18A and 18B, which may be of quartz or other suitable refractory material.

Figure 2:
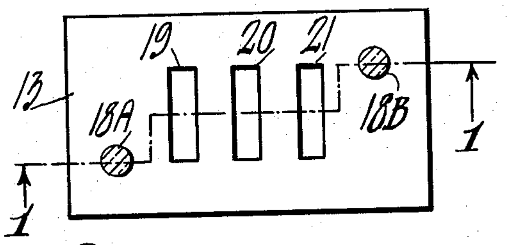
Figure 2 is a plan view of the central plate of the jig.

In Figure 2 the apertures 19, 20, 21 are made to correspond in width and depth to the length and width of the semiconductive wafers to be treated. Each aperture is made long enough to hold snugly the number of wafers it is desired to treat therein at one time.

Figure 3:
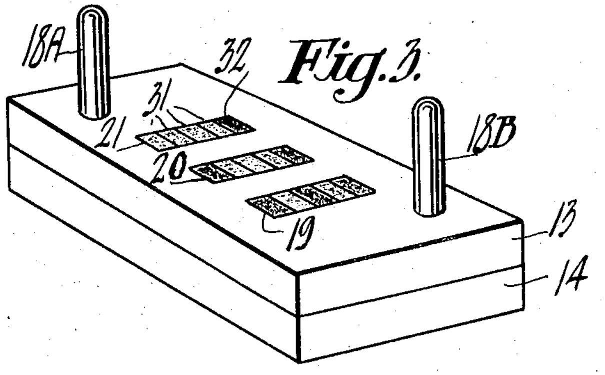
Figure 3 is an isometric view of the loaded jig with bottom and center plates only, assembled.

Referring to Figure 3, the central plate 13 is aligned on one end plate 14, and the semiconductor wafers 31 to be treated are placed in the apertures 19, 20, 21. In the example shown each well accommodates 5 wafers snugly. It is preferred to fill each well with the wafers, so that the unfilled volume is small. Accordingly 4 semiconductor wafers to be treated may be inserted in a well as shown in well 21. There is also placed in each well or aperture at least one source wafer 32 heavily doped with the particular conductivity type-determining impurity material to be diffused. If desired, a plurality of source wafers may be inserted in each well. Well 20 is shown containing 3 semiconductor wafers and 2 source wafers, while in well 19 the semiconductor wafers have been alternated with the source wafers. The jig is closed by covering the central plate 13 with the other end plate 12, and the assembly is then heated in a furnace. The atmosphere in the furnace should be of a non-oxidizing character, such as hydrogen, nitrogen, or the inert gases such as argon. In the case of silicon wafers, a small amount of oxygen may be used to protect the surface from pitting. The temperature and duration of heating depend on the volatility of the particular type-determining impurity material used, the amount of impurity material it is desired to diffuse into the wafers, and the desired depth of the junction.

Figure 4:
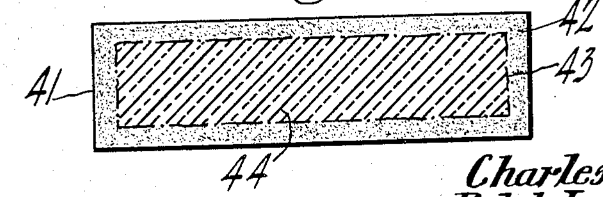
Figure 4 is a cross-section view of a semiconductor wafer which has been treated by the method of this invention.

Figure 4 shows a semiconductor wafer 41 treated by the method of this invention. The thin layer 42 containing diffused impurity material is shown surrounding the bulk of the unchanged semiconductor material 44, while between them is the rectifying junction 43.

As an example, and not as a limitation, the semiconductor wafers in which junctions are to be fabricated may be monocrystalline intrinsic germanium about 5 to 10 mils thick and having a cross-section about 0.5 inch square. The wafers are stacked in the well of a jig. Each well holds about 5 wafers snugly. There is inserted in the well at least one source wafer which contains a relatively high concentration of the desired impurity material. It has been found advantageous to use as the source a wafer of a heavily doped semiconductive material. This source wafer need not be monocrystalline, and need not be of the same material as the wafers to be treated. It may be made by the surface alloying of pellets of impurity material on a semiconductive wafer, or by any other convenient method. The amount of doping of this source wafer may be readily estimated by measuring the resistivity of the wafer. In this example, the source wafer is a pure germanium wafer that has been surface alloyed with arsenic pellets so that the wafer has a resistivity of about 0.001 ohm-centimeters. An alternative way to make the source wafers is to melt a quantity of pure germanium, and add enough arsenic to the melt to give the product a resistivity of 0.001 ohm-centimeters. The melt is cooled to form a bar with the desired size and shape of cross-section, and the bar is then cut into source wafers. It is preferred to have the source wafers about the same size as the semiconductor wafers to be treated. The assembled jig is heated in a hydrogen furnace for 15 minutes at 800° C. Vapors of arsenic are emitted by the source wafer, and fill the entire well, thus diffusing into all surfaces of each monocrystalline germanium wafer in the well. An I–N junction is thus formed about 0.2 mil below each surface of each semiconductor wafer.

Among the advantages of this method is the fact that the volume of air enclosed is so small that no vacuum pumping is necessary. The enclosure or well is kept sufficiently tight by the ground joints to insure a uniform concentration of arsenic vapor around the germanium wafers. The jig shown can be easily cleaned by placing it in an acid bath, since it has no blind corners. The method is readily adapted to mass production techniques, for example, by loading a series of jigs on a conveyor belt which moves the jigs through a furnace.

Although this invention has been described in terms of diffusing vapors of arsenic into semiconductor wafers of intrinsic germanium the method is equally adaptable to other N-type impurity materials such, for example, as antimony, phosphorus or bismuth. The method is also suitable for the introduction of P-type impurity materials such, for example, as gallium and indium by heating the assembly for longer periods, such as several hours. If a high melting semiconductor such as silicon is used, heating may be to higher temperatures, such as 1000° C. The jig is then preferably made of refractory materials such as aluminum oxide or ceramic.

The semiconductor wafers need not be intrinsic. The method will work equally well on N-type or P-type wafers, so that N–P, P–N, $PP^+$, and $NN^+$ junctions may be made. The semiconductor wafers can also be made of silicon, or silicon-germanium alloys, or compound semiconductors such, for example, as indium phosphide and gallium arsenide without departing from the spirit and scope of the invention.

The fabrication of a transistor will now be described as an illustration of how the method of this invention may be used in making semiconductor devices.

Monocrystalline germanium is prepared by any convenient known method, and is doped with P-type impurity such as indium to a resistivity of one ohm-centimeter. Wafers of the material are then cut about 0.5 inch long, 0.05 inch wide, and 5 to 10 mils thick. About four such wafers are placed in each well of the jig. A source wafer of the same size is prepared from germanium which has been grown from a melt doped with sufficient arsenic so as to have a resistivity of 0.001 ohm-centimeter. The assembly is then heated in a hydrogen furnace for 15 minutes at 800 ° C. Arsenic vapors diffuse from the source wafer into the surface of each P-type germanium wafer, and thus form a layer of N-type germanium over the entire surface of each wafer. This layer is about 0.2 mil thick. Since the bulk of the material is P-type, a P–N junction is thus produced, which is close to the surface of the wafer.

The semiconductor wafers having rectifying junctions made as above described may then be fabricated into transistor devices as follows.

Figure 5A:
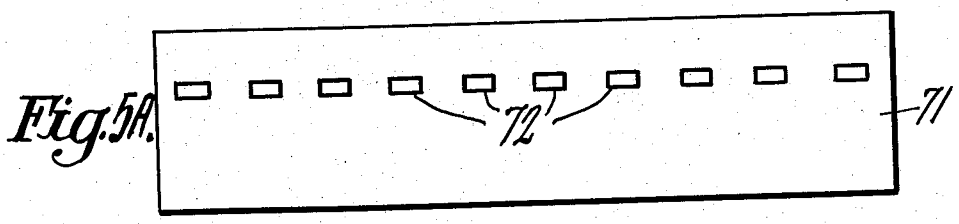
Figures 5A to 5C are schematic plan views of steps in the manufacture of a transistor according to the method of this invention.

Referring to Figure 5A, one broad surface of a P-conductivity type semiconductor wafer 71 diffused with arsenic as above described has a number of small areas covered with aluminum 72, deposited by evaporation, for example, to serve as emitter dots. The aluminum makes a surface barrier type rectifying junction with the arsenic-doped germanium. In this example ten such emitter areas are spaced along the face of the wafer.

Figure 5B:
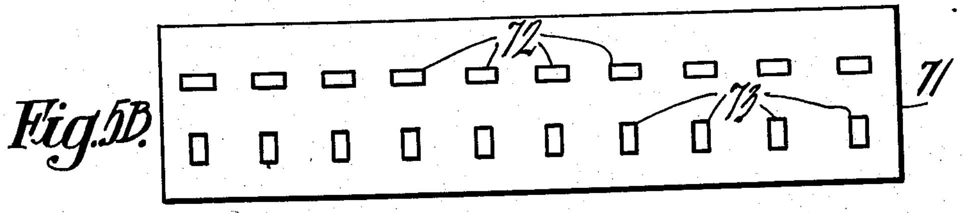

Referring to Figure 5B, a short distance from each emitter dot 72 a small area of the wafer surface is coated with a film of gold 73 containing about 0.5 percent antimony. Each gold dot 73 serves as an ohmic base connection.

Figure 5C:
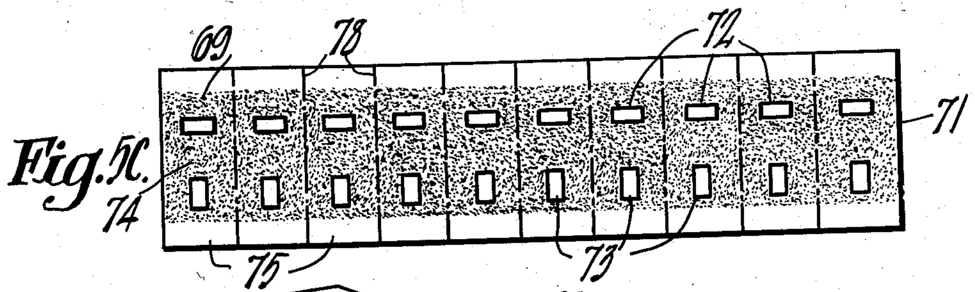

Referring to Figure 5C, a portion 69 of the wafer surface including and immediately surrounding the emitter dots 72 and the base dots 73 is covered with material 74 that resists acid etching, such as lacquer or polystyrene. The wafer is then immersed in a suitable acid etch so as to remove the entire diffused arsenic layer except for the area covered by the resist. One etchant that may be used consists of 1 part by volume of concentrated nitric acid, 1 part by volume of concentrated hydrofluoric acid, and 1 part by volume water. The wafer 71 is next washed in distilled water and then cut along lines 78 so as to form 10 units 75. Each unit contains an aluminum emitter dot and a gold-antimony base dot, a base region 69, and a collector region 70.

Figure 6:
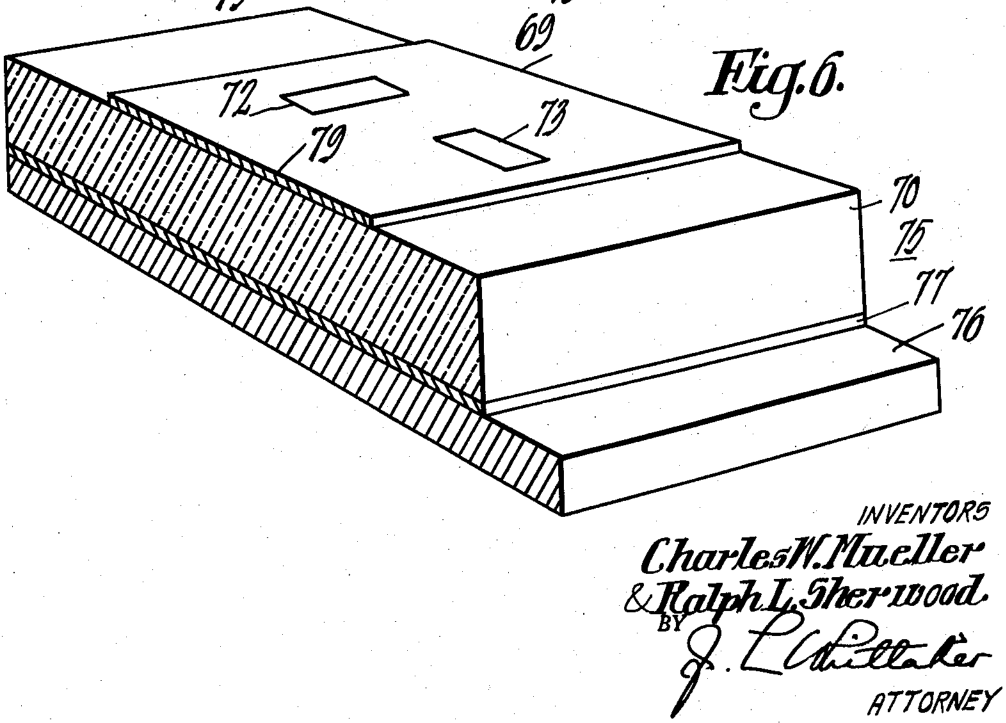
Figure 6 is an isometric view of a transistor unit fabricated according to the method of this invention.

Referring to Figure 6, each unit 75 is attached to a metal tab 76 by a layer of solder 77 on the surface of the collector region 70 opposite to the dot pair 72 and 73. The metal tab 76 servies as the collector electrode connection. Suitable metals for this purpose are nickel, copper, and Kovar. The solder 77 may for example be indium. The P–N junction 79 is between the P-conductivity type collector region 70 and the N-conductivity type base region 69 which was diffused with arsenic. The unit is completed by attaching leads (not shown) to the aluminum dot 72 as emitter, to the gold-antimony dot 73 as base, and to the metal tab 76 as collector electrode connection.

Satisfactory transistors have been made by this method, having an alpha ($\alpha cb$) ranging between 20 to 100. The units have a low frequency gain of 35 to 40 db, and an alpha cut-off frequency which ranges from 50 to 120 megacycles.

The source wafers used have been depleted of arsenic in a shallow region around the surface. They may be used over again after removing a layer 1 mil thick by immersing the wafers in an acid etch.

The etching compositions heretofore described are not critical in the practice of the invention. Other known etching compositions may be substituted. For example, the etching of germanium devices may be alternatively accomplished by electrolytic etching in alkaline solutions. If different materials are used, different etchants will be preferred.

A feature of this invention is that the concentration of the impurity vapor is kept low enough to prevent the formation of droplets of impurity material on the surface of the wafers. Such droplets sometimes form when the older methods are used. They are undesirable because they result in non-uniform junctions.

While the foregoing example has been directed to the fabrication of a transistor, the method outlined above is suitable for the manufacture of rectifiers or other types of semiconductive devices which contain at least one rectifying junction.

What is claimed is:

1. In the fabrication of rectifying junctions by the introduction of vaporized conductivity type-determining impurities into monocrystalline semiconductor wafers, the improvement comprising stacking said wafers in a well in a jig, said wafers substantially filling said well, inserting within said stack in said well at least one source wafer heavily doped with a conductivity type-determining impurity material, and heating said jig in a non-oxidizing atmosphere so that said conductivity type-determining impurity is emitted by said source wafer and diffuses into the surfaces of said monocrystalline wafers to form a rectifying junction at a pre-determined depth.

2. The method as in claim 1, in which the conductivity type-determining material is antimony.

3. The method as in claim 1, in which the conductivity type-determining material is arsenic.

4. The method as in claim 1, in which the conductivity type-determining material is indium.

5. The method as in claim 1, in which the conductivity type-determining material is gallium.

6. The method as in claim 1, in which the monocrystalline semiconductor alloys are made of a material selected from the group consisting of germanium, silicon, germanium-silicon alloys, indium phosphide, and gallium arsenide.

7. The method as in claim 1, in which each monocrystalline semiconductive wafer is alternated with a source wafer.

8. In the fabrication of rectifying junctions by the introduction of vaporized P-conductivity type-determining impurity material into monocrystalline semiconductive silicon wafers, the step comprising stacking said wafers in a well in a jig, said wafers substantially filling said well, inserting in said well a source wafer of semiconductive material heavily doped with gallium, and heating said jig in an argon atmosphere four hours at 1000° C. so that the gallium diffuses into all the surfaces of said silicon wafers to form a rectifying junction at a pre-determined depth.

9. In the fabrication of rectifying junctions by the introduction of vaporized N-type conductivity type-determining impurity material into monocrystalline semiconductive germanium wafers, the step comprising stacking said wafers in a well in a jig, said wafers substantially filling said well, inserting in said well a source wafer of semiconductive material having a high concentration of arsenic, and heating said jig in a hydrogen atmosphere for 15 minutes at 800° C., so that the arsenic diffuses into all the surfaces of said germanium wafers to form a rectifying junction at a pre-determined depth.

10. A method of introducing rectifying junctions into a plurality of given conductivity type semiconductor wafers, comprising placing a source wafer of said semiconductor heavily doped with an impurity capable of converting said semiconductor wafers to a desired conductivity type in close proximity to said semiconductor wafers, heating said semi-conductor wafers together with said source wafer within an enclosed space having a volume approximately the same as the total volume of said wafers without exhausting the air from said space, said wafers being heated in a substantially non-oxidizing atmosphere at a temperature high enough so that vapors of said impurity are emitted by said source wafer and form within said enclosed space an atmosphere of said impurity surrounding said semiconductor wafers without forming droplets thereon, and continuing heating for a time sufficient to diffuse said impurity into the surface of said semiconductor wafers to a predetermined depth and thereby form said rectifying junctions therein.

References Cited in the file of this patent

UNITED STATES PATENTS 2,695,852 Sparks ---------------- Nov. 30, 1954

UNITED STATES PATENT OFFICE
CERTIFICATE OF CORRECTION

January 20, 1959

Patent No. 2,870,049

Charles W. Mueller et al.

It is hereby certified that error appears in the printed specification of the above numbered patent requiring correction and that the said Letters Patent should read as corrected below.

Column 4, line 27, for "servies" read -- serves --; line 71, strike out "within said stack".

Signed and sealed this 12th day of May 1959.

(SEAL)
Attest:

KARL H. AXLINE
Attesting Officer

ROBERT C. WATSON
Commissioner of Patents